United States Patent
Dotson et al.

(10) Patent No.: US 7,203,916 B2
(45) Date of Patent: Apr. 10, 2007

(54) SYSTEM, METHOD AND PROGRAM PRODUCT FOR POSITIONING I/O PADS ON A CHIP

(75) Inventors: Michael W. Dotson, Binghamton, NY (US); Matthew D. Wise, Binghamton, NY (US)

(73) Assignee: International Business Machines Corporation, Armonk, NY (US)

( * ) Notice: Subject to any disclaimer, the term of this patent is extended or adjusted under 35 U.S.C. 154(b) by 243 days.

(21) Appl. No.: 10/602,369

(22) Filed: Jun. 24, 2003

(65) Prior Publication Data

US 2004/0268281 A1 Dec. 30, 2004

(51) Int. Cl.
*G06F 17/50* (2006.01)

(52) U.S. Cl. .............. 716/5; 716/10; 716/13; 716/14; 703/16

(58) Field of Classification Search .......... 716/10, 716/12, 2, 8, 5, 13, 14; 703/16
See application file for complete search history.

(56) References Cited

U.S. PATENT DOCUMENTS

| | | |
|---|---|---|
| 5,525,985 A | 6/1996 | Schlotterer et al. |
| 5,544,088 A | 8/1996 | Aubertine et al. |
| 5,648,912 A | 7/1997 | Narayanan et al. |
| 5,751,234 A | 5/1998 | Schlotterer et al. |
| 6,242,814 B1 * | 6/2001 | Bassett ................ 257/786 |
| 6,457,157 B1 * | 9/2002 | Singh et al. ............ 716/2 |
| 6,499,134 B1 * | 12/2002 | Buffet et al. ............ 716/12 |
| 6,584,606 B1 * | 6/2003 | Chiu et al. .............. 716/10 |
| 6,941,258 B2 * | 9/2005 | Van Heijningen et al. .... 703/16 |
| 7,111,265 B1 * | 9/2006 | Tan et al. ............... 716/10 |
| 2002/0022951 A1 * | 2/2002 | Heijningen et al. ....... 703/16 |
| 2003/0033578 A1 * | 2/2003 | Chan et al. .............. 716/2 |
| 2003/0075812 A1 * | 4/2003 | Cheng et al. ............ 257/784 |
| 2003/0099190 A1 * | 5/2003 | Zerbe ..................... 370/201 |

OTHER PUBLICATIONS

G. Yasar et al., "I/O Cell Placement and Electrical Checking Methodology for ASICs with Peripheral I/Os", IEEE 2001, Quality Electronic Design, 2001 International Symposium on☐☐ Mar. 26-28, 2001 pp. 71-75.*

* cited by examiner

*Primary Examiner*—Phallaka Kik
(74) *Attorney, Agent, or Firm*—William H. Steinberg; Hoffman, Warnick & D'Alessandro LLC

(57) ABSTRACT

Under the present invention, a proposed placement of I/O pads into one or more groups on a chip analyzed. Specifically, using resources such as a control file, cross-reference table, an I/O limit table, and an optional information file, a group switching current for each proposed I/O pad group is automatically calculated and compared to predetermined maximum switching current(s). If an I/O pad group exhibits a switching current that exceeds its predetermined maximum, corrective action is taken. Such action can include, for example, relocation of an I/O pad from an overloaded I/O pad group to another I/O pad group, insertion of an additional power pad into the overloaded I/O pad group, etc.

22 Claims, 3 Drawing Sheets

SYSTEM, METHOD AND PROGRAM PRODUCT FOR POSITIONING I/O PADS ON A CHIP

BACKGROUND OF THE INVENTION

1. Field of the Invention

In general, the present invention provides a system, method and program product for positioning I/O pads on a chip. Specifically, under the present invention, I/O pads are positioned on a wire bond chip based upon an automatic comparison of a group switching current to a predetermined maximum switching current.

2. Related Art

As microelectronic devices become more advanced and pervasive, better methods for developing chip designs are needed. For example, today peripheral wire bond chips are a popular technology. In general, a peripheral wire bond chip includes I/O pads or cells positioned in groups around a periphery thereof. Each I/O pad group generally includes a power pad for providing the necessary power to the group. The chip is typically mounted on a carrier, which is mounted on a card or the like through the use of a module balls or the like. Wire leads generally extend from the I/O pads to wire bond pads to provide electrical connectivity between the components. The positioning of the I/O pads on the chip is important to the overall functionality of the package because improper positioning could lead to various errors and malfunctions.

One typical characteristic that should be considered when positioning I/O pads is switching current. Specifically, each I/O pad group has a maximum switching current that can be sustained. However, it could be the case that a proposed arrangement of I/O pads would exceed this threshold. For example, assume that a particular chip is be able to sustain a total of 500 milliamperes for a single I/O pad group. Further assume that a group of nine I/O pads, each having a switching current of 60 milliamperes, is proposed for placement on the chip. In this case, the maximum switching current of 500 milliamperes would be exceeded because the proposed group would generate a total of 540 milliamperes. Accordingly, an alternative design must be achieved.

Currently, there is no existing technology that automatically checks switching currents for I/O pad groups. Specifically, today one or more testers must either manually make the necessary calculations for a proposed design, or actually implement the design and then test the resulting chip. Neither option is efficient or cost effective since a single chip could have a large quantity of pad groups. If a tester wished to examine switching current, he/she must make the necessary analysis for each pad group. Moreover, if the initial analysis required relocation of an I/O pad, the calculation must be repeated for the group receiving the I/O pad. Thus, the testing of a single chip can take several days.

In view of the foregoing, there exists a need for a system, method and program product for positioning I/O pads on a chip. Specifically, a need exists for a way to automatically determine whether group switching currents for proposed placements of I/O pad groups on a chip would exceed a predetermined maximum switching current. A further need exists for corrective action to be taken if any group switching current exceeds a maximum switching current. For example, a need exists for an I/O pad to be relocated to another I/O pad group such that a maximum switching current is not exceeded, or for an additional power pad to be inserted into the I/O pad group.

SUMMARY OF THE INVENTION

In general, the present invention provides a system, method and program product for positioning I/O pads on a chip (e.g., a peripheral wire bond chip). Specifically, under the present invention a control file that identifies, among other things, a proposed placement of I/O pads into one or more groups on a chip is accessed and analyzed. Then, using other resources such as a cross-reference table, an I/O limit table, and an optional information file, a group switching current for each proposed I/O pad group is automatically calculated and compared to predetermined maximum switching current(s). If an I/O pad group exhibits a switching current that exceeds its predetermined maximum, corrective action is taken. Such action can include, for example, relocation of an I/O pad from an overloaded I/O pad group to another I/O pad group, insertion of an additional power pad into the overloaded I/O pad group, etc.

A first aspect of the present invention provides a system for positioning I/O pads on a chip, comprising: an information access system for accessing a control file that includes a proposed placement of a set of I/O pad groups on the chip; a calculation system for calculating a group switching current of a particular I/O pad group identified in the control file based on individual switching currents of each I/O pad in the particular I/O pad group, and for comparing the group switching current to a predetermined maximum switching current; and a corrective action system for implementing a corrective action if the group switching current exceeds the predetermined maximum switching current.

A second aspect of the present invention provides a computer-implemented method for positioning I/O pads on a chip, comprising: providing a control file that includes a proposed placement of a set of I/O pad groups on the chip; calculating a group switching current of a particular I/O pad group identified in the control file based on individual switching currents of each I/O pad in the particular I/O pad group; comparing the group switching current to a predetermined maximum switching current; and implementing a corrective action if the group switching current exceeds the predetermined maximum switching current.

A third aspect of the present invention provides a program product stored on a recordable medium for positioning I/O pads on a chip, which when executed comprises: program code for accessing a control file that includes a proposed placement of a set of I/O pad groups on the chip; program code for calculating a group switching current of a particular I/O pad group identified in the control file based on individual switching currents of each I/O pad in the particular I/O pad group, and for comparing the group switching current to a predetermined maximum switching current; and program code for implementing a corrective action if the group switching current exceeds the predetermined maximum switching current.

Therefore, the present invention provides a system, method and program product for positioning I/O pads on a chip.

BRIEF DESCRIPTION OF THE DRAWINGS

These and other features of this invention will be more readily understood from the following detailed description of the various aspects of the invention taken in conjunction with the accompanying drawings in which.

Figure 1:
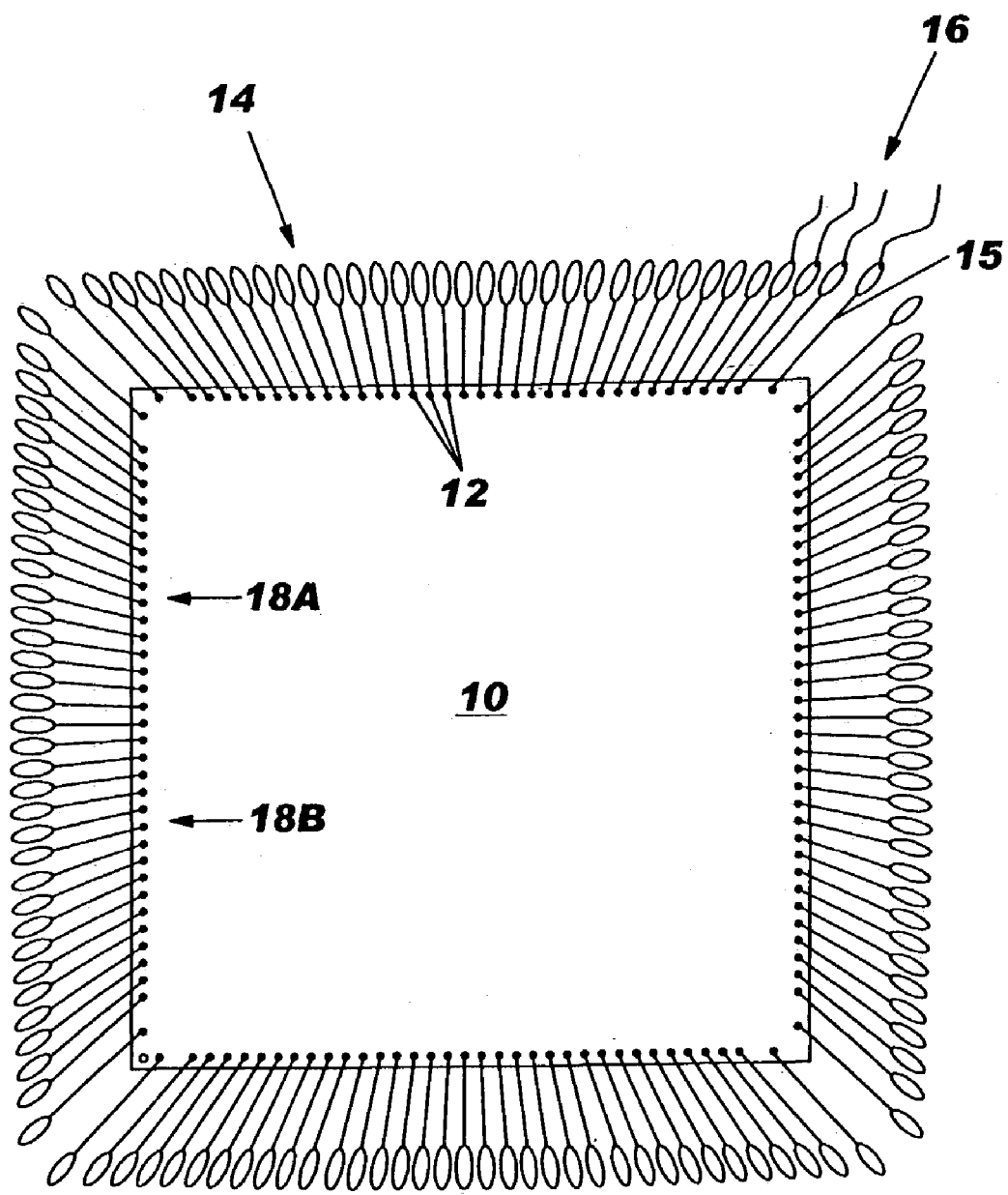
FIG. 1 depicts a top view of peripheral wire bond chip.

The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

As indicated above, the present invention provides a system, method and program product for positioning I/O pads on a chip (e.g., a peripheral wire bond chip). Specifically, under the present invention a control file that identifies, among other things, a proposed placement of I/O pads into one or more groups on a chip is accessed and analyzed. Then, using other resources such as a cross-reference table, an I/O limit table, and an optional information file, a group switching current (di/dt) for each proposed I/O pad group is automatically calculated and compared to predetermined maximum switching current(s) (di/dt max). If an I/O pad group exhibits a switching current that exceeds its predetermined maximum, corrective action is taken. Such action can include, for example, relocation of an I/O pad from an overloaded I/O pad group to another I/O pad group, insertion of an additional power pad into the overloaded I/O pad group, etc.

Figure 2:
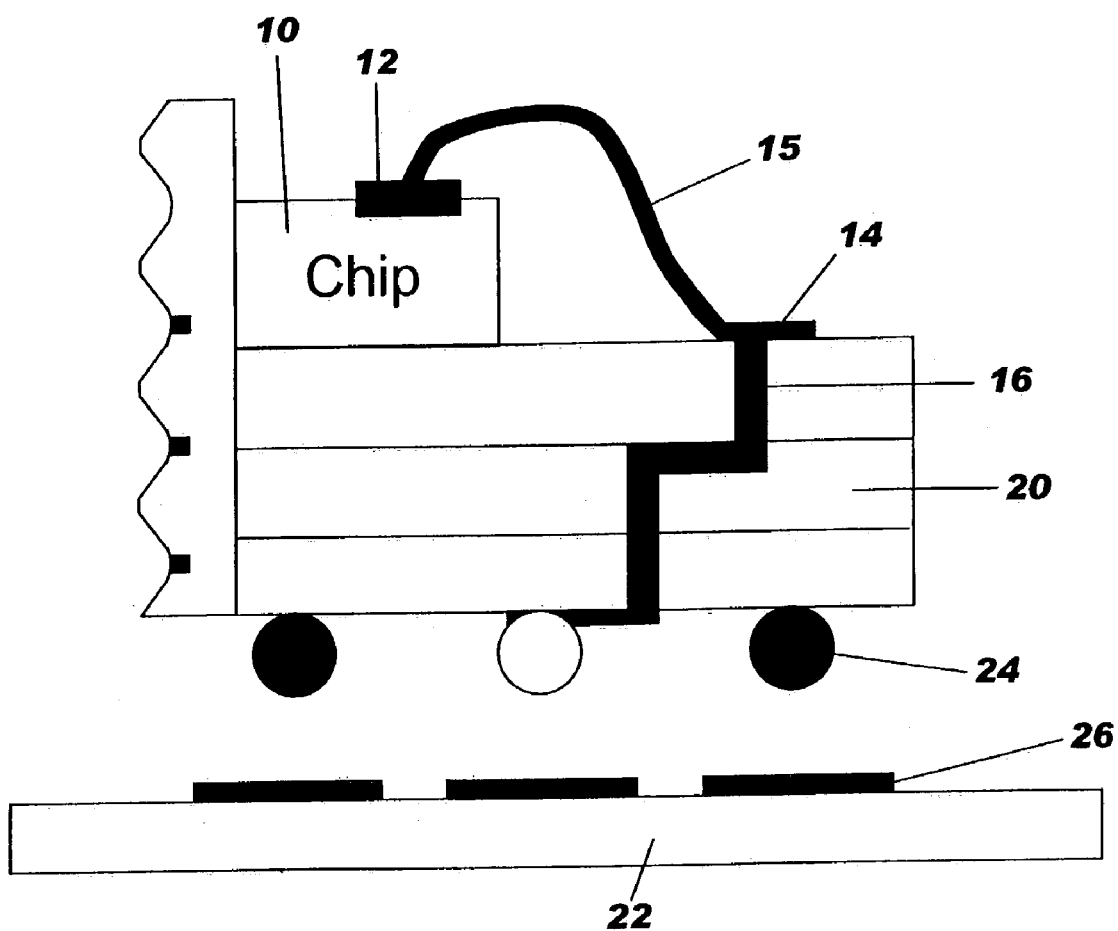
FIG. 2 depicts a side view of the peripheral wire bond chip, a chip carrier to which the chip is attached, and a card to which the carrier is attached

Referring now to FIG. 1, a chip 10 is shown. As depicted, chip 10 is a peripheral wire bond chip on which groups of I/O pads 12 are positioned. Specifically, chip 10 includes ports (not shown) about a periphery thereof into which I/O pads/cells 12 are positioned. I/O pads 12 are generally positioned on chip 10 in groups between two "power" pads. For example, group 18A could be one I/O pad group, while group 18B could be another I/O pad group. Therefore, each I/O pad group 18A–B typically has two power pads. However, if a group is located at an end of chip 10, it could only have one power pin. In any event, once I/O pads 12 are positioned, wire bonds 15 can be attached thereto to provide connectivity to substrate 14. In addition, traces 16 extend along substrate 14 to provide connectivity to other components. For example, referring to FIG. 2, chip 10 is attachable to chip carrier 20, which itself is attachable to a card 22 or the like. In a typical embodiment, chip carrier 20 attaches to card 22 via module balls 24 and bonding pads 26. As can be seen, wire bond 15 connects I/O pad 12 to substrate 14. Traces 16 then provide the necessary connectivity between chip 10, chip carrier 20 and card 22 by connecting substrate 14 to module ball 24.

As indicated above, the grouping and positioning of I/Q pads 12 on chip 10 must take various factors into consideration. Once such factor is switching current. Specifically, a group switching current for a particular I/O pad group (e.g., 18A) should not exceed a predetermined maximum switching current. If it does, corrective action should be taken. The present invention provides a way to automatically and efficiently make this determination for all I/O pad groups on chip 10 and take any necessary action(s). It should be understood that the particular arrangement of I/O pads 12 of FIG. 1 is only one possible embodiment and that other variations exist. For example, chip 10 could include additional "rows" of pads adjacent to those currently shown in FIG. 1.

Figure 3:
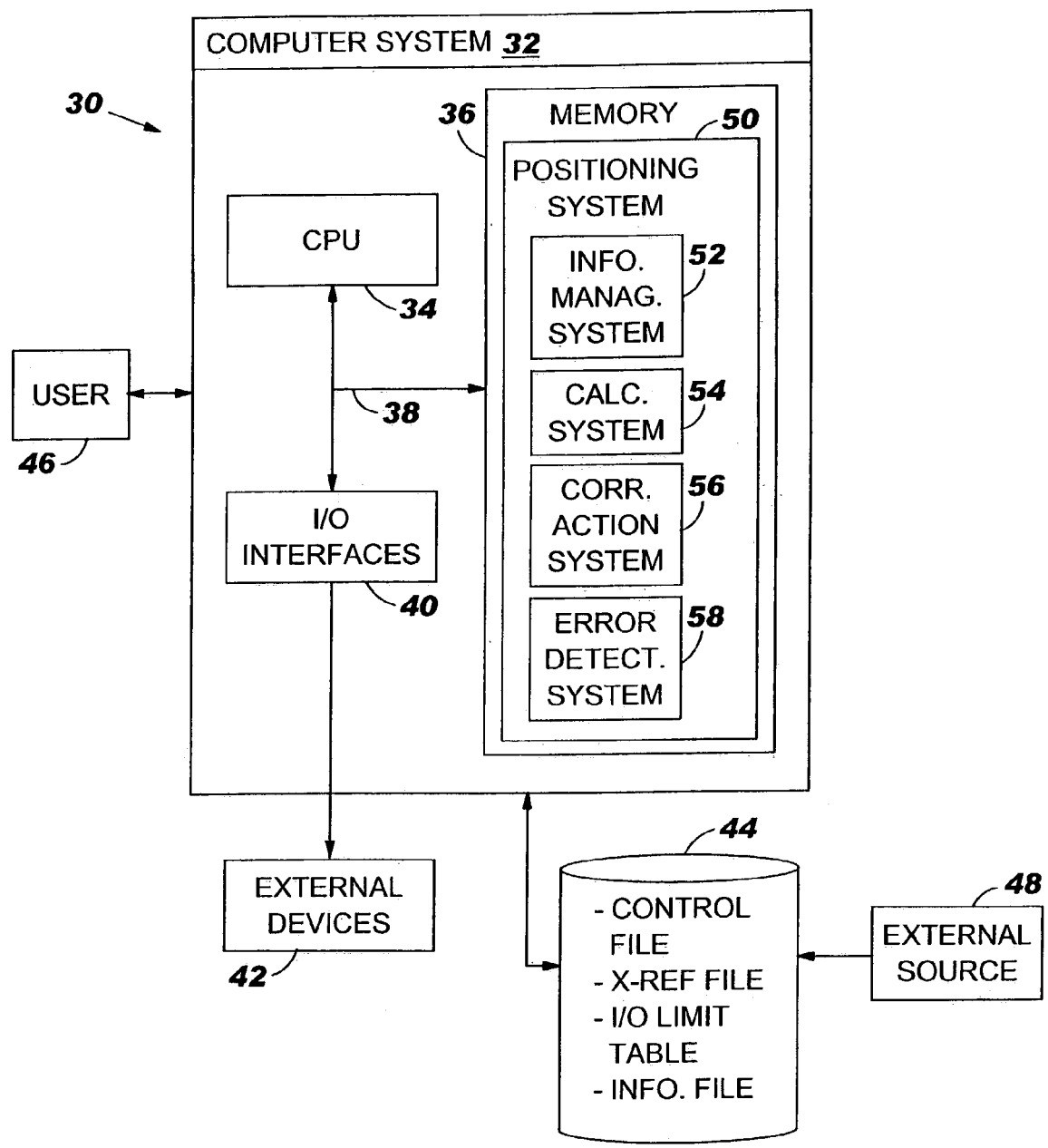
FIG. 3 depicts a system for positioning I/O pads on a chip, according to the present invention.

Referring now to FIG. 3, system 30 for positioning I/O pads under the present invention is shown. As depicted system 30 includes computer system 32 which generally comprises central processing unit (CPU) 34, memory 36, bus 38, input/output (I/O) interfaces 40, external devices/ resources 42 and storage unit 44. CPU 34 may comprise a single processing unit, or be distributed across one or more processing units in one or more locations, e.g., on a client and server. Memory 36 may comprise any known type of data storage and/or transmission media, including magnetic media, optical media, random access memory (RAM), read-only memory (ROM), a data cache, a data object, etc. Moreover, similar to CPU 34, memory 36 may reside at a single physical location, comprising one or more types of data storage, or be distributed across a plurality of physical systems in various forms.

I/O interfaces 40 may comprise any system for exchanging information to/from an external source. External devices/resources 42 may comprise any known type of external device, including speakers, a CRT, LCD screen, hand-held device, keyboard, mouse, voice recognition system, speech output system, printer, monitor/display, facsimile, pager, etc. Bus 38 provides a communication link between each of the components in computer system 32 and likewise may comprise any known type of transmission link, including electrical, optical, wireless, etc.

Storage unit 44 can be any system (e.g., a database) capable of providing storage for information such as a control file, a cross-reference file, an I/O limit table, an information file, etc. under the present invention. As such, storage unit 44 could include one or more storage devices, such as a magnetic disk drive or an optical disk drive. In another embodiment, storage unit 44 includes data distributed across, for example, a local area network (LAN), wide area network (WAN) or a storage area network (SAN) (not shown). It should also be understood that although not shown, additional components, such as cache memory, communication systems, system software, etc., may be incorporated into computer system 32.

In general, computer system 32 is intended to represent any type of computerized system that is accessed by user 46 (e.g., a chip tester, or engineer) to design chip 10 (FIG. 1). For example, computer system 32 could represent a personal computer, workstation, laptop, hand held device, etc. To this extent, computer system 32 could represent a stand-alone or network-based computerized system. In the case of the latter, user 46 could directly operate a computerized "user system" (not shown) that communicates with computer system 32. Such communication could occur via a direct hardwired connection (e.g., serial port), or via an addressable connection in a client-server (or server-server) environment that may utilize any combination of wireline and/or wireless transmission methods. In the case of an addressable connection, the server and client may be connected via the Internet, a wide area network (WAN), a local area network (LAN), a virtual private network (VPN) or other private network. The server and client may utilize conventional network connectivity, such as Token Ring, Ethernet, WiFi or other conventional communications standards. Where the client communicates with the server via the Internet, connectivity could be provided by conventional TCP/IP sockets-based protocol. In this instance, the client would utilize an Internet service provider to establish connectivity to the server.

Shown in memory 36 is positioning system 50, which utilizes various files and information to automatically position (i.e., recommend a particular placement of) I/O pads 12 on chip 10. Specifically, positioning system 50 will utilize a control file, a cross-reference file, an I/O limit table and, optionally, an information file to position the I/O pads 12 on chip 10. In general, the control file identifies, among other things, a proposed placement and grouping of I/O pads 12 on chip 10. The cross-reference file contains various pieces of technical information such as: (1) where the power, grounds and signal locations are on chip 10; (2) where the "signal" I/O pads are and what type of testing requirements a signal pad might have; and (3) a cross-reference between the I/O pads 12, module balls 24A-C and wire bonds 15. The I/O limit table contains the switching current for the individual I/Q pads 12 used. If used, the information file is used to determine the necessary maximum switching current(s) and the pad groups for chip 10. However, it should be understood that any data in the information file could be determined from the cross-reference file. In a typical embodiment; the control file is provided by user 46, while the cross-reference file, I/O limit table and information file (are provided) are typically provided by an external source 48 (e.g., the provider of chip 10). To this extent, information management system 52 will provide any necessary interfaces and logic to receive, store and access this information.

Listed below is a portion of an illustrative control file. It should be understood in advance that the below portion only lists one I/O pad group for illustrative purposes. It should be appreciated that an actual control file will likely contain listings for a set of (i.e., one or more) I/O pad groups.

be multiplied by the corresponding multiplier to determine the actual switching current of the I/O pad listed in the control file.

Once all necessary files and information are provided, the most appropriate and compliant positioning of I/O pads 12 will be automatically determined. First, the control file will be parsed by information access system 52 to determine the layout and grouping of I/O pads being proposed. Then, calculation system 54 will use the information in the control file to cross-reference the I/O limit table to determine the individual switching currents for each I/O pad. Using this information, calculation system 54 will determine the sum of the individual switching currents to determine a group switching current for each I/O pad group. For example, if a I/O pad group has four pads that each have a switching current of 60 milliamperes, the group switching current will be 240 milliamperes. Where there are multiple I/O pad groups proposed for placement of chip 10, a group switching current will be determined for each such group.

Once the group switching current(s) are determined, calculation system 54 will compare the group switching currents to the predetermined maximum switching current (e.g., as determined using the information file or from the cross-reference file). If a particular group switching current does not exceed the maximum switching current, its proposed placement is valid, and no corrective action need be taken with respect to that particular group. However, if the group switching current for the particular I/O pad group exceeds the predetermined maximum switching current, the group can be considered as "overloaded" and corrective action system 56 will take appropriate corrective action. Typically,

| GROUP | SIGNAME | BTR | LOCATION | USE | MULTI. |
|---|---|---|---|---|---|
| EBC around iopad SAA | EBC_XANT | B3350T_A | cnSAA | BIDIR | 1 # center group EBC |
| EBC location of cnSAA | EBC_SERR | B3350_A | — | BIDIR | 1 # this will have a |
| EBC at SAG | EBC_PERR | BT3350PDT_A | fzSAG | BIDIR | 1 # this will be frozen |
| EBC location of cnSAA | EBC_WAL | B3350_A | — | OUTPUT2 | 1 # this will have a |

The control file portion depicted above provides a proposed layout of a group of I/O pads named group "EBC" (e.g., as proposed by user 46). Specifically, each row in the above control file pertains to a single I/O pad in the group. Thus, the group proposed in the above control file has four I/O pads. The column headings of the control file shown have the following meanings:

GROUP: The name of the I/O pad group to which the I/O pad pertains.

SIGNAME: The name of the signal used by the I/O pad.

BTR: Where to look in the I/O limit table for this I/O pin's switching current

LOCATION: Where on chip 10 the I/O pad should be placed

USE: The function(s) of the I/O pad

MULTI: A multiplier to be used in the event that the specific I/O pad is not listed in the I/O limit table. Specifically, the switching current listed in the I/O limit table could be for an I/O pad that is similar to the one listed in the control file. In this case, the listed switching current should unless a group is located at an end of a "power rail," the maximum switching current is the same for all I/O pad groups.

In one embodiment, corrective action system 56 will relocate (e.g., change the design, or recommend such a change) one or more I/O pads from an overloaded I/O pad group to a non-overloaded I/O pad group so that the group switching current will no longer exceed the maximum switching current. For example, if the maximum switching current is 200 milliamperes, and I/O pad group "A" includes four pads that each have a switching current of 60 milliamperes, one I/O pad can be relocated from group "A" to I/O pad group "B." When relocating I/O pads in this manner, the group switching current for the receiving group (e.g., group "B") should be recalculated to ensure that the insertion does not cause it to exceed the maximum switching current. In another embodiment, corrective action system 56 could insert (e.g., change the design or recommend such a change) of an additional power pad into the overloaded I/O pad group. This essentially amounts to splitting the single, overloaded I/O pad group into two separate I/O pad groups. Thus, if the group switching current for an I/O pad group was 240 milliamperes, the insertion of an additional power pad into that group would yield two separate I/O pad groups that each have a group switching current of 120 milliamperes.

As further shown in FIG. 3, positioning system 50 also includes error detection system 58, which detects and reports errors in the control file (and optionally in the cross-reference file, I/O limit table and information file). Specifically, since the control file will likely be "human" generated (e.g., by user 46), there is a chance it could contain errors (e.g., typographical, etc.) For example, the control file may reference an entry in the I/O limit table that does not exist. In such a case, the error will be detected by error detection system 58 and promptly reported to user 46 for correction.

It should be understood that the present invention can be realized in hardware, software, or a combination of hardware and software. Any kind of computer/server system(s)—or other apparatus adapted for carrying out the methods described herein—is suited. A typical combination of hardware and software could be a general purpose computer system with a computer program that, when loaded and executed, carries out the respective methods described herein. Alternatively, a specific use computer, containing specialized hardware for carrying out one or more of the functional tasks of the invention, could be utilized. The present invention can also be embedded in a computer program product, which comprises all the respective features enabling the implementation of the methods described herein, and which—when loaded in a computer system—is able to carry out these methods. Computer program, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

The foregoing description of the preferred embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims. For example, although a particular depiction of positioning system 50 has been shown in FIG. 3, other variations could be implemented. For example, the systems within positioning system 50 could be combined into fewer systems.

We claim:

1. A system for positioning I/O pads on a chip, comprising:
   an information access system for accessing a control file that includes a proposed placement of a set of I/O pad groups on the chip, wherein each of the set of I/O pad groups includes at least one power pad;
   a calculation system for calculating a group switching current of a particular I/O pad group identified in the control file based on individual switching currents of each I/O pad in the particular I/O pad group, and for comparing the group switching current to a predetermined maximum switching current; and
   a corrective action system for implementing a corrective action if the group switching current exceeds the predetermined maximum switching current.

2. The system of claim 1, wherein the corrective action system relocates at least one I/O pad in the particular I/O pad group to another I/O pad group if the group switching current exceeds the predetermined maximum switching current.

3. The system of claim 1, wherein each of the set of I/O pad groups includes one power pad.

4. The system of claim 3, wherein the corrective action system inserts an additional power pad into the particular I/O pad group if the group switching current exceeds the predetermined maximum switching current.

5. The system of claim 1, wherein the individual switching currents are determined from an I/O limit table, and wherein the maximum switching current is determined from an information file.

6. The system of claim 1, wherein the chip is a peripheral wire bond chip.

7. The system of claim 1, further comprising an error detection system for detecting and reporting errors in the control file.

8. A computer-implemented method for positioning I/O pads on a chip, comprising:
   providing a control file that includes a proposed placement of a set of I/O pad groups on the chip, wherein each of the set of I/O pad groups includes at least one power pad;
   calculating a group switching current of a particular I/O pad group identified in the control file based on individual switching currents of each I/O pad in the particular I/O pad group;
   comparing the group switching current to a predetermined maximum switching current; and
   implementing a corrective action if the group switching current exceeds the predetermined maximum switching current.

9. The method of claim 8, wherein the calculating step comprises calculating a group switching current of a particular I/O pad group identified in the control file by summing individual switching currents of each I/O pad in the particular I/O pad group.

10. The method of claim 8, wherein the implementing step comprises relocating at least one I/O pad in the particular I/O pad group to another I/O pad group if the group switching current exceeds the predetermined maximum switching current.

11. The method of claim 8, wherein each of the set of I/O pad groups includes one power pad.

12. The method of claim 11, wherein the implementing step comprises inserting an additional power pad into the particular I/O pad group if the group switching current exceeds the predetermined maximum switching current.

13. The method of claim 8, wherein the individual switching currents are determined from an I/O limit table, and wherein the maximum switching current is determined from an information file.

14. The method of claim 8, further comprising:
   detecting errors in the control file; and
   reporting the errors.

15. The method of claim 8, wherein the chip is a peripheral wire bond chip.

16. A program product stored on a recordable medium for positioning I/O pads on a chip, which when executed comprises:
   program code for accessing a control file that includes a proposed placement of a set of I/O pad groups on the chip, wherein each of the set of I/O pad groups includes at least one power pad;

program code for calculating a group switching current of a particular I/O pad group identified in the control file based on individual switching currents of each I/O pad in the particular I/O pad group, and for comparing the group switching current to a predetermined maximum switching current; and program code for implementing a corrective action if the group switching current exceeds the predetermined maximum switching current.

17. The program product of claim 16, wherein the program code for implementing a corrective action relocates at least one I/O pad in the particular I/O pad group to another I/O pad group if the group switching current exceeds the predetermined maximum switching current.

18. The program product of claim 16, wherein each of the set of I/O pad groups includes one power pad.

19. The program product of claim 18, wherein the program code for implementing a corrective action inserts an additional power pad into the particular I/O pad group if the group switching current exceeds the predetermined maximum switching current.

20. The program product of claim 16, wherein the individual switching currents are determined from an I/O limit table, and wherein the maximum switching current is determined from an information file.

21. The program product of claim 16, further comprising program code for detecting and reporting errors in the control file.

22. The program product of claim 16, wherein the chip is a peripheral wire bond chip.

* * * * *